United States Patent
Su et al.

(10) Patent No.: US 12,370,648 B2
(45) Date of Patent: Jul. 29, 2025

(54) SURFACE CLEAN SYSTEM AND METHOD

(71) Applicant: Taiwan Semiconductor Manufacturing Co., Ltd., Hsinchu (TW)

(72) Inventors: Pei-Yi Su, Taichung (TW); Cheng-Chieh Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1131 days.

(21) Appl. No.: 17/119,464

(22) Filed: Dec. 11, 2020

(65) Prior Publication Data

US 2021/0237228 A1    Aug. 5, 2021

Related U.S. Application Data

(60) Provisional application No. 62/968,046, filed on Jan. 30, 2020.

(51) Int. Cl.
*B24D 3/34* (2006.01)
*B24B 53/017* (2012.01)
*H01L 21/304* (2006.01)

(52) U.S. Cl.
CPC ............ *B24D 3/346* (2013.01); *B24B 53/017* (2013.01); *H01L 21/304* (2013.01)

(58) Field of Classification Search
CPC . B24D 3/346; B24D 3/34; B24D 3/20; B24D 2202/00; B24B 53/017;

(Continued)

(56) References Cited

U.S. PATENT DOCUMENTS 6,287,037 B1 * 9/2001 Hay .................. A46B 11/0079
401/278
7,632,434 B2 * 12/2009 Duescher ............ C09K 3/1436
264/13

(Continued)

FOREIGN PATENT DOCUMENTS

TW         313535 B       8/1997
TW         I233384 B      6/2005

(Continued)

OTHER PUBLICATIONS

A Nastic, et al. Instrumented and Vickers Indentation for the Characterization of Stiffness, Hardness and Toughness of Zirconia Toughened Al2O3 and SiC Armor, Journal of Materials Science & Technology, vol. 31, Iss 8, 2015, pp. 773-783. DOI: 10.1016/j.jmst.2015.06.005. (Year: 2015).*

*Primary Examiner* — Amber R Orlando
*Assistant Examiner* — Marites A Guino-O Uzzle
(74) *Attorney, Agent, or Firm* — Seed IP Law Group LLP

(57) ABSTRACT

A portable handheld cleaning device is provided capable of cleaning the surface of the substrate table without damaging the surface. The portable handheld cleaning device in accordance with the present disclosure includes a base having a first side and a second side (the first side and the second side overlapping each other), a hollow structure on the first side of the base, and a weight holding space within the hollow structure. A grinding pad is provided on the second side of the base. The grinding pad includes a cleaning surface, the cleaning surface having a plurality of substantial pyramid shaped grits.

20 Claims, 12 Drawing Sheets

(58) Field of Classification Search
CPC .......... B24B 53/00; B24B 7/06; B24B 53/02; B24B 53/12; B24B 37/24; B24B 37/245; B24B 37/14; B24B 37/16; B24B 37/26; H01L 21/304; H01L 21/67028; H01L 21/302; H01L 21/00
See application file for complete search history.

(56) References Cited

U.S. PATENT DOCUMENTS

| | | | | |
|---|---|---|---|---|
| 2012/0220205 A1* | 8/2012 | Wu | ..................... | B24D 3/14 51/307 |
| 2013/0078895 A1* | 3/2013 | Dinh-Ngoc | ........... | B24B 53/017 451/443 |
| 2017/0095903 A1* | 4/2017 | Galpin | ................... | B24B 37/20 |
| 2019/0015875 A1* | 1/2019 | Gardner, Jr. et al. | ... | A47L 17/08 |

FOREIGN PATENT DOCUMENTS

| | | |
|---|---|---|
| TW | 201910055 A | 3/2019 |
| TW | 202135984 A | 10/2021 |

\* cited by examiner

SURFACE CLEAN SYSTEM AND METHOD

PRIORITY CLAIM AND CROSS-REFERENCE

This application claims the benefit of U.S. Provisional Patent Application No. 62/968,046, filed Jan. 30, 2020, which is incorporated by reference herein in its entirety.

BACKGROUND

To produce semiconductor devices, a semiconductor substrate, such as a silicon wafer, which is a raw material for the semiconductor devices, must go through a sequence of complicated and precise process steps. Often, to complete the sequence, the wafer must be physically transported from one piece of fabrication equipment to another piece of fabrication equipment. Within these pieces of fabrication equipment, various processes such as diffusion, ion implantation, chemical vapor deposition, photolithography, etching, physical vapor deposition, and chemical mechanical polishing are carried out on the semiconductor substrate.

Photolithography, also called optical lithography or UV lithography, is a process used to transfer a pattern of a photomask (i.e., template) onto a photoresist coated surface of the substrate (i.e., wafer) using light. Subsequent processing includes etching that creates a permanent pattern of the photomask on the substrate.

During an alignment step of the photolithography, the substrate coated with the photoresist is placed on a wafer table which controls position of the substrate in X, Y, Z, and θ for alignment with the light. In a subsequent process, the pattern is transferred onto the substrate by exposing the substrate to the light through the photomask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
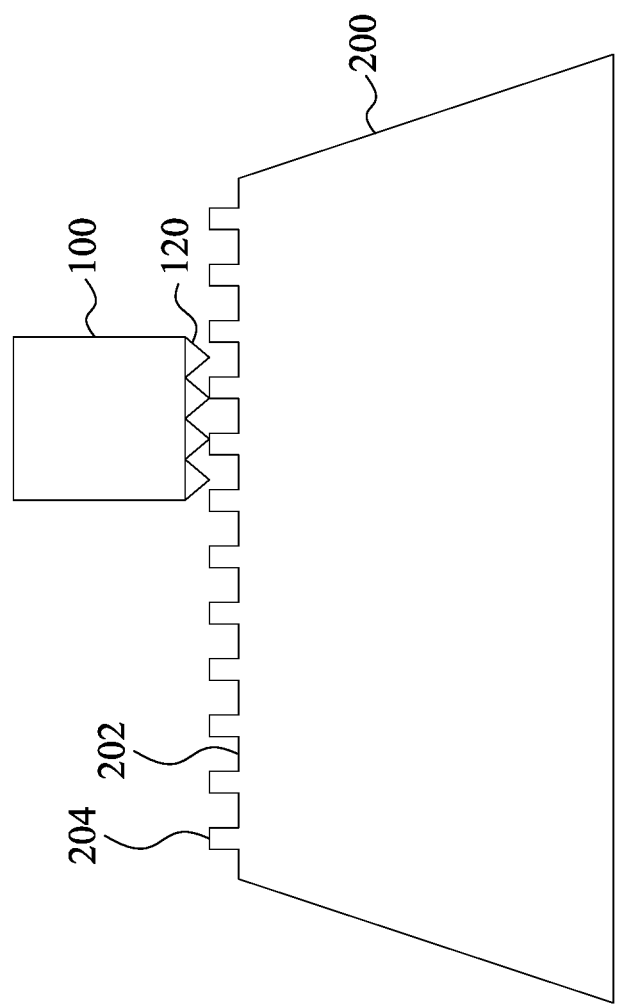
FIG. 1 is a schematic view of a substrate table 200 that is being cleaned by a portable handheld cleaning device 100 according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, a photolithography tool includes a light source, a condenser lens, a photomask, projection lens, and a substrate table. Intense light (e.g., UV light) from the light source travels through the condenser lens, the photomask, and the projection lens. In an exposure step, the light from the light source is directed onto a photoresist coated substrate, after passing the condenser lens, the photomask, and the projection lens. By exposing the substrate to the light, a pattern from the photomask is transferred onto the substrate.

To focus the light from the light source onto the substrate evenly for the entire surface of the substrate, the cleanliness of the substrate table (e.g., free from contaminants) where the substrate sits during the alignment and exposure step is important. If a surface of the substrate table where the substrate sits during the alignment and exposure step is contaminated, the substrate is unable to lie flat on the substrate table, which means the light cannot be properly focused onto the substrate on the substrate table. When the light is not properly focused, the accuracy of the transfer of the mask to the substrate suffers.

Embodiments in accordance with the subject matter described herein include surface cleaning devices that are able to efficiently remove the contaminants from the surface of the substrate table in a photolithography tool or metrology tool. As discussed above, during the alignment and exposure step in the photolithography process, it is important to have the substrate table free from any contaminants in order to promote accurate focus of the light onto the substrate.

FIG. 1 is a schematic view of a substrate table 200 that is being cleaned by a portable handheld cleaning device 100 according to one or more embodiments of the present disclosure.

Figure 2:
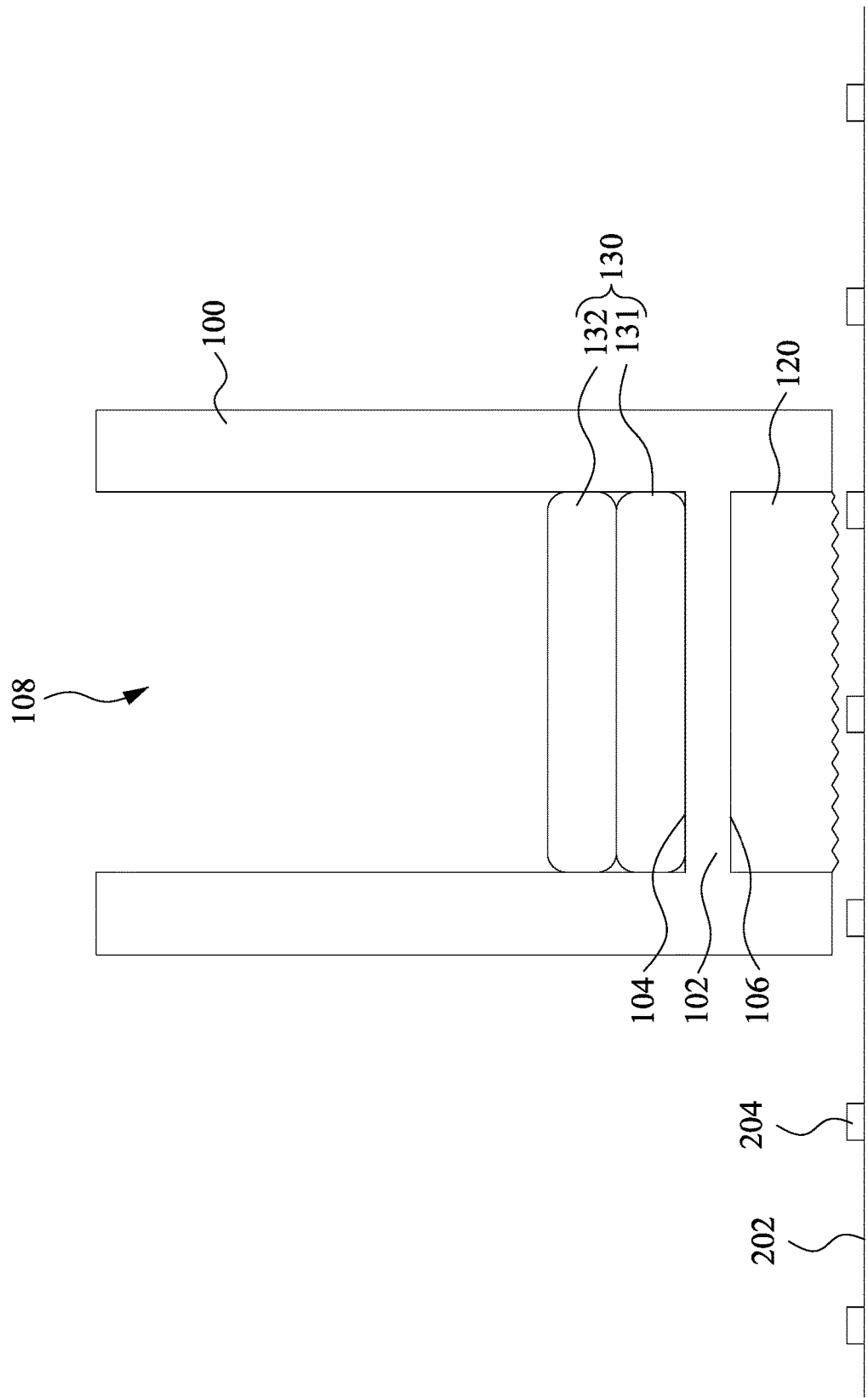
FIG. 2 is a cross-sectional view of the portable handheld cleaning device 100 on the substrate table 200 according to one or more embodiments of the present disclosure.

FIG. 2 is a cross-sectional view of the portable handheld cleaning device 100 on the substrate table 200 according to one or more embodiments of the present disclosure.

Referring to FIGS. 1 and 2, the portable handheld cleaning device 100 includes a base 102, a first side 104 of the base 102, a second side 106 of the base 102, a hollow structure 108 on the first side 104, and cleaning pad 120 on the second side 106. As illustrated in FIG. 2, the second side 106 of the base 102 is overlapped with the first side of the base 102 in a vertical direction.

Further referring to FIGS. 1 and 2, the substrate table 200 includes a surface 202 where the substrate is placed during the exposure step. Surface 202 includes a plurality of burls 204 (or pins, knobs or protuberances) to slightly elevate the substrate relative to surface 202 and reduce contact between the substrate and the surface 202 of the substrate table 200 to prevent the substrate from sticking on the surface 202 of the substrate table 200. Cleaning pad 120 is configured to remove contaminants on the surface 202, on the burls 204 and in the spaces between the burls 204 as a cleaning operator moves the portable handheld cleaning device 100 on the surface 202 to clean the entire surface 202.

In accordance with one or more embodiments of the present disclosure, the hollow structure 108 of the portable handheld cleaning device 100 is configured to provide a space to hold one or more weight member 130.

In the illustrated embodiment in FIG. 2, the hollow structure 108 provides the space for one 20 grams weight member 131 and one 10 grams weight member 132. The cleaning operator can adjust a total weight of the weight member 130 in the hollow structure 108 by adding the weight member 130 into the hollow structure 108 or removing the weight member 130 from the hollow structure 108.

As illustrated in FIG. 2, the hollow structure 108 provides the space for the weight member 130 in different weights. In a non-limiting example, the weight member 130 can be in 1-gram (or increments of 1-gram), 5-grams (or increments of 5-grams), 10-grams (or increments of 10-grams), and 20-grams (or increments of 20-grams). The total weight of the weight members 130 in the hollow structure 108 provides substantial pressure that is evenly distributed over the entire or considerable portion of the cleaning pad 120. The pressure from the total weight of the weight members 130 in the hollow structure 108 eventually forces a cleaning side of the cleaning pad 120 rubbed (or scrubbed) against the surface 202 of the substrate table 200. More details on the cleaning pad 120 will be provided later in the present disclosure.

In accordance with one or more embodiments of the present disclosure, the total weight of the weight members 130 in the hollow structure 108 is between 10 grams and 150 grams. In some embodiments, the total weight of the weight members 130 in the hollow structure 108 is less than 10 grams. In some embodiments, the total weight of the weight members 130 in the hollow structure 108 is more than 150 grams. Using the substantially even pressure from the weight members 130 in the hollow structure 108, the cleaning operator can evenly clean the entire surface 202 of the substrate table 200 while steadily maintaining the even pressure to the surface 202 of the substrate table 200. In other words, the cleaning operator can evenly clean the surface 202 of the substrate table 200 without damaging the surface 202 by applying uniform pressure throughout the surface 202.

As discussed above, the total weight of the weight members 130 in the hollow structure 108 is adjustable. Accordingly, the cleaning operator can select the appropriate weight member 130 or a combination of the weight members 130 based on a level of contamination of the surface 202 of the substrate table 200. For a non-limiting example, the cleaning operator can select a combination of the 20 grams weight member 131 and the 10 grams weight member 132 (i.e., total 30 grams) to clean the surface 202 that is lightly contaminated. For another non-limiting example, the cleaning operator can select a combination of the 20 grams weight member 131, the 10 grams weight member 132, and a 100 grams weight member (i.e., total 130 grams) to clean the surface 202 that is heavily contaminated.

The total weight of the weight members 130 in the hollow structure 108 is also determined based on a structure of the burls 204. For a non-limiting example, for the substrate table 200 with the burls 204 formed in a high density, the cleaning operator can select a combination of weight members 130 that is heavier than for the substrate table 200 with the burls 204 formed in a low density. Additional total weight in the hollow structure 108 provides additional pressure that is necessary to remove the contamination in the gaps (or grooves) formed between the plurality of the burls 204.

Accordingly, in some embodiments, for the substrate table 200 with the burls 204 formed in the low density, the cleaning operator can select a combination of weight members 130 that is lighter than for the substrate table 200 with the burls 204 formed in the high density.

As shown in the illustrated embodiment in FIG. 2, each of the weight members 131 and 132 in the hollow structure 108 has a circular shape (e.g., coin shape). However, the present disclosure does not limit the shape of the weight member 130. Weight member 130 can be formed in a suitable shape to fit into the hollow structure 108. In some embodiments of the present disclosure, the weight member 130 can be in any suitable shapes that can be stackable in the hollow structure 108. For a non-limiting example, the weight member 130 is formed in a suitable shape such as circular shape, a triangular shape, a square shape, a rectangular shape, an octagon shape, a pentagon shape, a hexagon shape, a heptagon shape, or a nonagon shape.

In some embodiments of the present disclosure, the weight member 130 can be in any suitable shapes based on assigned weight of the weight member 130. In a non-limiting example, the weight member 130 that weighs 10 grams is in a circular shape, the weight member 130 that weighs 25 grams is in a triangular shape, and the weight member 130 that weighs 100 grams is in a rectangular shape. By assigning different shapes for weight members 130 based on the assigned weight, the cleaning operator can easily recognize the weight for each of the weight members 130 while stacking the weight members 130 in the hollow structure 108.

In some embodiments of the present disclosure, the hollow structure 108 provides a space corresponding to the shape of the weight member 130. In other words, the hollow structure 108 is formed in a suitable shape such as circular hollow shape, triangular hollow shape, a square hollow shape, a rectangular hollow shape, an octagon hollow shape, a pentagon hollow shape, a hexagon hollow shape, a heptagon hollow shape, or a nonagon hollow shape.

Figure 3:
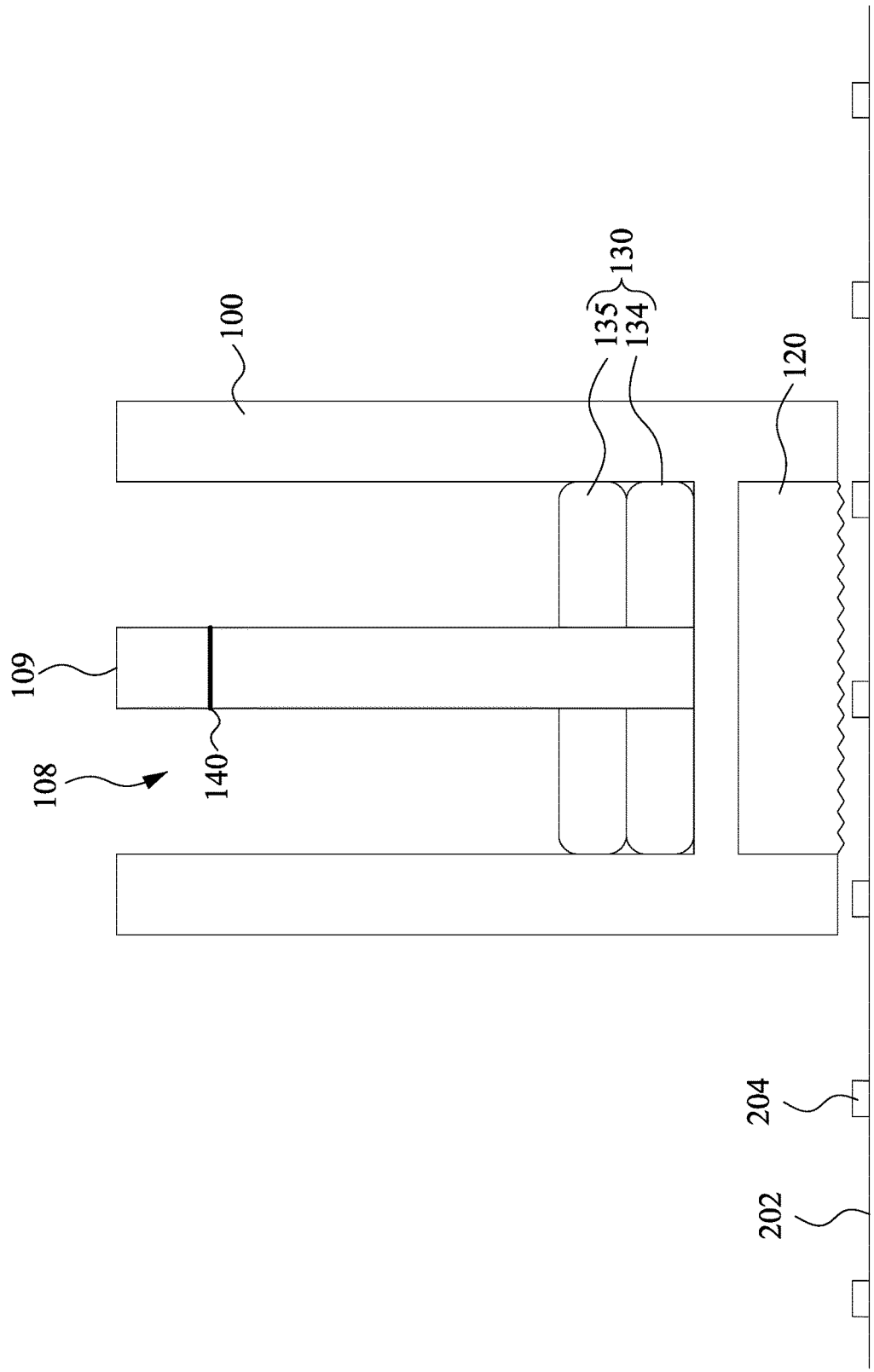
FIG. 3 is a cross-sectional view of the portable handheld cleaning device 100 on the substrate table 200 according to one or more embodiments of the present disclosure.

FIG. 3 is a cross-sectional view of the portable handheld cleaning device 100 on the substrate table 200 according to one or more embodiments of the present disclosure.

Referring to FIG. 3, the portable handheld cleaning device 100 including the base 102, the first side 104 of the base 102, the second side 106 of the base 102, the hollow structure 108 on the first side 104, the cleaning pad 120 on the second side 106, and a post 109 on the first side 104. As discussed above, the second side 106 of the base 102 is overlapped with the first side of the base 102 in a vertical direction.

In accordance with one or more embodiments of the present disclosure, the post 109 in the hollow structure 108 of the portable handheld cleaning device 100 is configured to serve as an alignment structure for the weight members 130.

In the illustrated embodiment in FIG. 3, the hollow structure 108 provides the space for one 20 grams weight member 134 and one 10 grams weight member 135. The cleaning operator can adjust the total weight of the weight member 130 in the hollow structure 108 by adding the weight member 130 into the hollow structure 108 or removing the weight member 130 from the hollow structure 108.

As discussed above, the hollow structure 108 provides the space for the weight member 130 in different weights. In a non-limiting example, the weight member 130 can be in 1-gram (or increments of 1-gram), 5-grams (or increments of 5-grams), 10-grams (or increments of 10-grams), and 20-grams (or increments of 20-grams). The total weight of the weight member 130 in the hollow structure 108 provides substantial pressure that is evenly distributed over the entire or considerable portion of the cleaning pad 120. The pressure from the total weight of the weight members 130 in the hollow structure 108 eventually forces the cleaning side of the cleaning pad 120 rubbed (or scrubbed) against the surface 202 of the substrate table 200. More details on the cleaning pad 120 will be provided later in the present disclosure.

As discussed above, the total weight of the weight members 130 in the hollow structure 108 is adjustable. Accordingly, the cleaning operator can select appropriate weight member 130 or a combination of the weight members 130 based on a level of contamination of the surface 202 of the substrate table 200 and/or the density of the burls 204 in the substrate table 200.

As illustrated in FIG. 3, the post 109 in the hollow structure 108 provides additional support for the weight members 130 in the hollow structure 108. As the cleaning operator moves the portable handheld cleaning device 100 on the substrate table 200 during a cleaning process, the post 109 secures the 20 grams weight member 134 and the 10 grams weight member 135 in the hollow structure 108 from sliding side by side in the hollow structure 108 in the illustrated embodiment. Post 109 on the first side 104 secures the weight members 130 in the hollow structure 108 so that a steady pressure from the weight member 130 is transferred or applied to the cleaning pad 120 during the cleaning process.

In the illustrated embodiments of the present disclosure, the post 109 is formed as a circular pole (e.g., pipe) and each of the weight members 134 and 135 in the hollow structure 108 has a circular shape (e.g., coin shape) with a circular hole in the middle that matches with the post 109.

The present disclosure does not limit the shape of the hole in the weight member 130 and shape of the post 109. The hole in the weight member 130 and the post 109 can be in any suitable shapes that the weight member 130 and the post 109 fit together. In a non-limiting example, the hole in the weight member 130 is formed in a suitable shape such as circular shape, a triangular shape, a square shape, a rectangular shape, an octagon shape, a pentagon shape, a hexagon shape, a heptagon shape, or a nonagon shape. Accordingly, the post 109 is formed in a suitable shape that matches the shape of the hole in the weight member 130.

In one or more embodiments of the present disclosure, the post 109 includes an indicator 140 that indicates a maximum height the weight members 130 can be stacked up to for a safety reason. Indicator on the post 109 helps a user to avoid placing too many weights within hollow structure 108. When too many weights are placed in hollow structure 108, the risk of a weight accidently falling onto surface 202 of the substrate during the cleaning process increases. In addition, placing too many weights in hollow structure 108 can result in too much pressure being applied by the cleaning pad 120 onto surface 202 of the substrate table 200.

Figure 4:
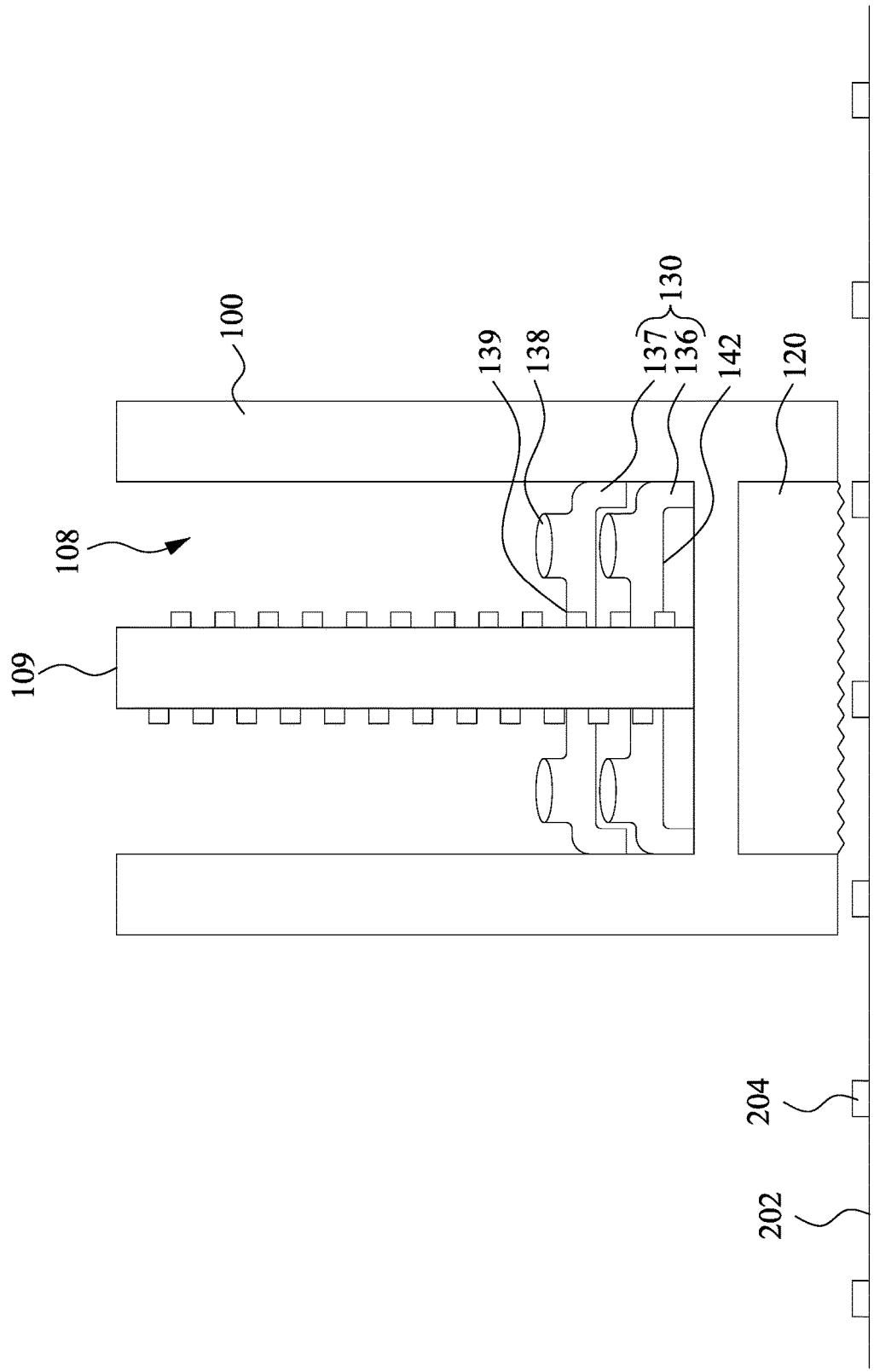
FIG. 4 is a cross-sectional view of the portable handheld cleaning device 100 on the substrate table 200 and weight members 130 each includes a threaded hole 139 in the middle, protrusions 138, and a recessed area 142 according to one or more embodiments of the present disclosure.

FIG. 4 is a cross-sectional view of the portable handheld cleaning device 100 on the substrate table 200 and the weight members 130 each includes a threaded hole 139 in the middle, a protrusion 138, and a recessed area 142 according to one or more embodiments of the present disclosure.

Referring to FIG. 4, as discussed above, the portable handheld cleaning device 100 includes the base 102, the first side 104 of the base 102, the second side 106 of the base 102, the hollow structure 108 on the first side 104, the cleaning pad 120 on the second side 106, and a post 109 on the first side 104. As discussed above, the second side 106 of the base 102 is overlapped with the first side of the base 102 in a vertical direction.

As illustrated in FIG. 4, in some embodiments of the present disclosure, the post 109 in the hollow structure 108 is threaded to receive the weight member 130 with a threaded hole 139 in the middle.

In one or more embodiments of the present disclosure, the weight members 130 with the threaded hole 139 are securely screwed to the post 109 that is threaded to match with the thread hole 139.

In the illustrated embodiment in FIG. 4, the hollow structure 108 provides the space for one 20 grams weight member 136 and one 10 grams weight member 137. Each of the weight members 136, 137 includes the threaded hole 139. The cleaning operator can adjust a total weight of the weight member 130 in the hollow structure 108 by screwing the weight member 130 into the hollow structure 108 or unscrewing the weight member 130 out of the hollow structure 108.

In some embodiments of the present disclosure, the weight member 130 includes at least one protrusion 138 on the top surface. In the illustrated embodiment in FIG. 4, two protrusions 138 are disposed on the top surface. The cleaning operator can easily screw or unscrew the weight member 130 by turning the protrusions 138 on the top surface of the weight 130. In some embodiments, the weight member 130 includes a recessed area 142, which is formed in a shape that allows the recessed area 142 to receive the protrusion 138. This arrangement allows for a larger number of weight members 130 to be stacked in the hollow structure 108 compared to if the weight members do not include such recessed areas 142.

Figure 5A:
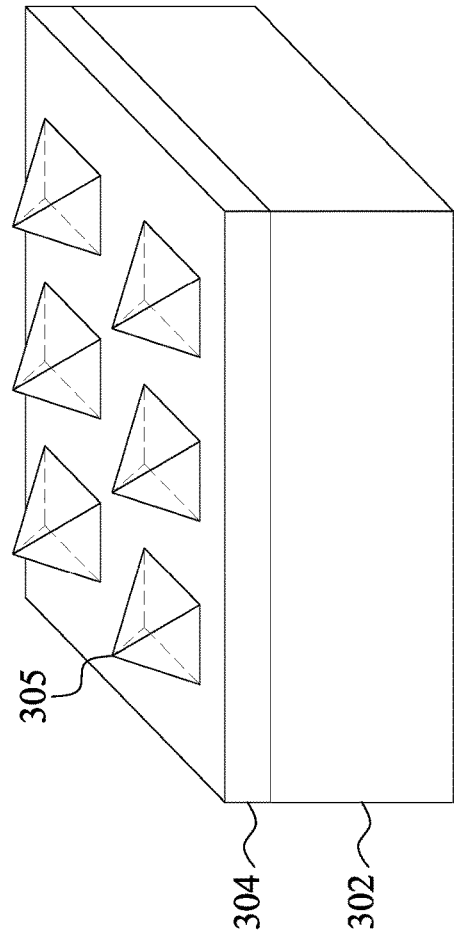
FIGS. 5A-5G are perspective cross-sectional views of various cleaning pads 120 according to one or more embodiments of the present disclosure.

FIG. 5A is a perspective cross-sectional view of the cleaning pad 120 that is configured to attach to the second side 106 of the portable handheld cleaning device 100 according to one or more embodiments of the present disclosure.

Referring to FIG. 5A, in accordance with the illustrated embodiment, the cleaning pad 120, which is coupled (or attached) to the portable handheld cleaning device 100 includes a base layer 302, an adhesive layer 304 on the base layer 302, and a plurality of (substantial) pyramid shaped structures (e.g., grits) on the adhesive layer 304.

Base layer 302 is constructed of any suitable material that has the ability of resuming its normal shape after being compressed by the weight member 130 and has the ability to absorb the impact from the burls 204 as the cleaning pad 120 rubs against the burls 204. For a non-limiting example, the base layer 302 may be constructed of rubber, soft plastic such as polyurethane foam or the like, or combinations thereof. Base layer 302 is not limited to being constructed from the exemplary materials mentioned above but may be formed of any material that can absorb impact created during the cleaning process.

Adhesive layer 304 on the base layer 302 is constructed of any suitable material that can position the plurality of pyramid shaped structures 305 (and/or a plurality of bar shaped structures 307 which will be discussed later) on the base layer 302. For a non-limiting example, the adhesive layer 304 may be constructed of adhesive fabric, adhesive thin film, or combinations thereof. Adhesive layer 304 is not limited to being constructed from the exemplary materials mentioned above but may be formed of any material that can position the plurality of pyramid shaped structures 305 on the base layer 302.

The plurality of pyramid shaped structures 305 (and/or the plurality of bar shaped structures 307) on the adhesive layer 304 are constructed of any suitable material that can remove the contaminants on the surface 202 of the substrate table 200 without damaging the surface 202. For a non-limiting example, the plurality of pyramid shaped structures 305 (and the plurality of bar shaped structures 307) may be constructed of silicon carbide (SiC), silicon nitride (Si3N4), aluminum nitride (AlN), or combinations thereof. The plurality of pyramid shaped structures 305 (and the plurality of bar shaped structures 307) is not limited to being constructed from the exemplary materials mentioned above but may be formed of any suitable materials having a similar hardness of the surface 202 of the substrate table 200. In some embodiments, the plurality of pyramid shaped structure 305 (and the plurality of bar shaped structures 307) is constructed from one or more materials having a hardness in a range between 800 HV and 3000 HV.

In some embodiments of the present disclosure, the plurality of pyramid shaped structures 305 are aligned in both X and Y directions, each of the plurality of pyramid shaped structures 305 are parallel to an adjacent pyramid shaped grits 305.

In the illustrated embodiments in FIGS. 5A-5G, the plurality of pyramid shaped structures 305 are constructed with square-based pyramid shaped structures. However, the present disclosure does not limit the base shape for the pyramid shaped structures. For a non-limiting example, the plurality of pyramid shaped structures 305 can be constructed of triangular-based pyramid shaped structures, rectangular-based shaped structures, pentagon-based pyramid shaped structures, hexagonal-based pyramid shaped structures, or combinations thereof.

In some embodiments of the present disclosure, a plurality of bar shaped structures 307 also can be used in lieu of the plurality of pyramid shaped structures 305 or in conjunction with the plurality of pyramid shaped structures 305.

Figure 5B:
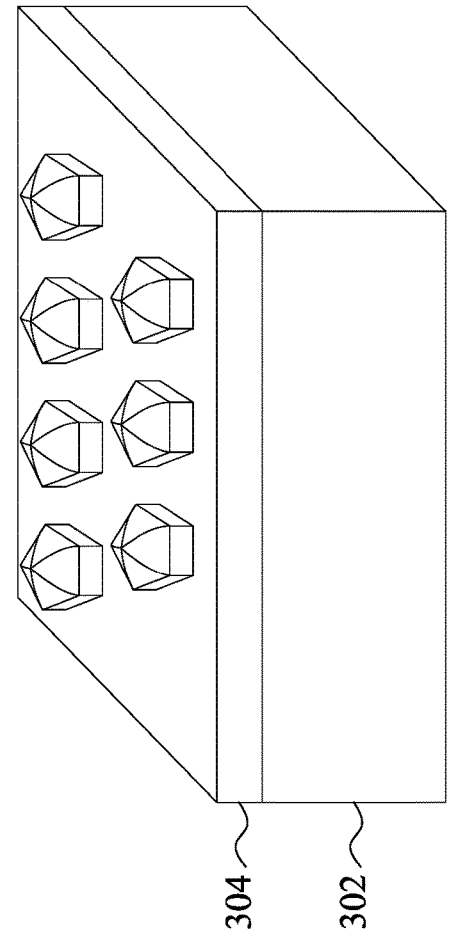
Figure 5C:
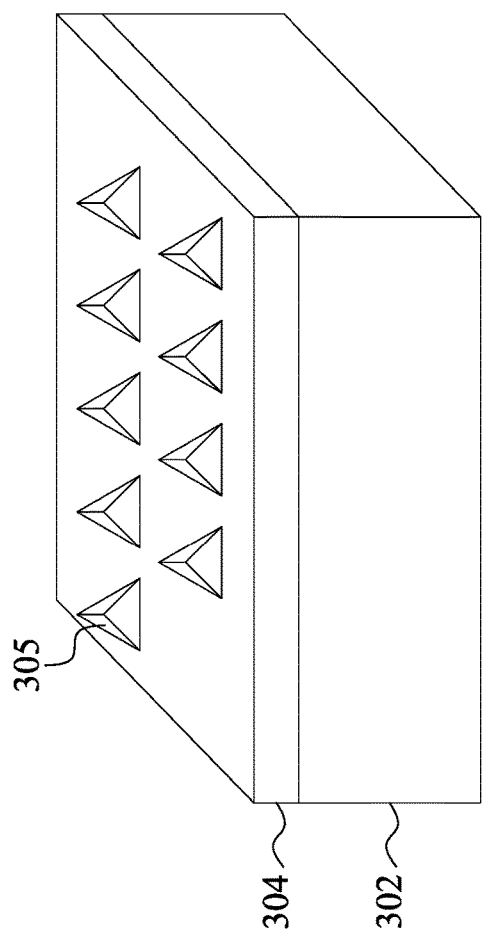

Each of the FIGS. 5B and 5C is a perspective cross-sectional view of the cleaning pad 120 that is configured to attach to the second side 106 of the portable handheld cleaning device 100 according to one or more embodiments of the present disclosure.

Referring to FIG. 5B, in accordance with various illustrated embodiments, the cleaning pad 120, which is coupled (or attached) to the portable handheld cleaning device 100 includes a base layer 302, an adhesive layer 304 on the base layer 302, and a pentagonal pyramid-based pyramid shaped structures 305 on the adhesive layer 304.

Referring to FIG. 5C, in accordance with various illustrated embodiments, the cleaning pad 120, which is coupled (or attached) to the portable handheld cleaning device 100 includes a base layer 302, an adhesive layer 304 on the base layer 302, and a triangular-based pyramid shaped structures 305 on the adhesive layer 304.

Figure 5D:
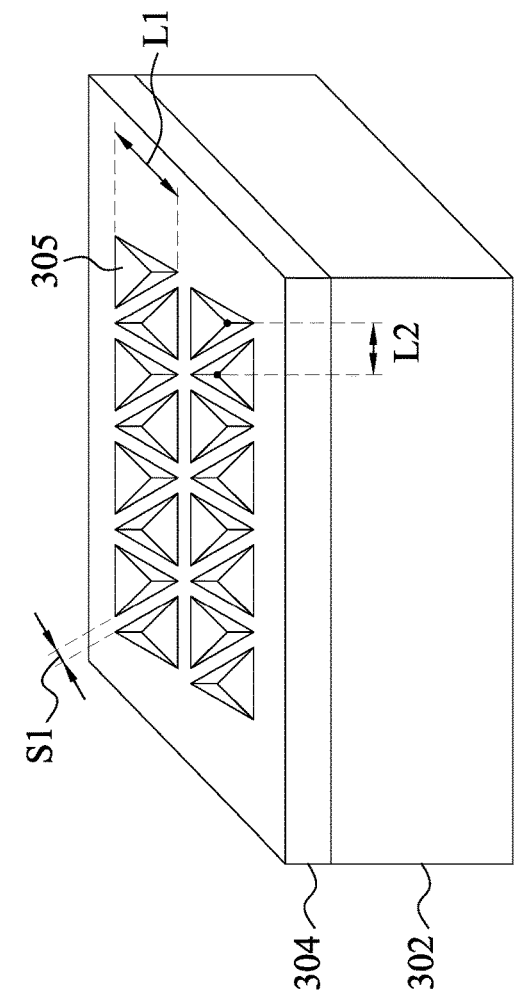

FIG. 5D is a perspective cross-sectional view of the cleaning pad 120 that is configured to attach to the second side 106 of the portable handheld cleaning device 100 according to one or more embodiments of the present disclosure.

Referring to FIG. 5D, the plurality of pyramid shaped structures 305 is constructed of triangular-based pyramid shaped structures in an alternating pattern.

In accordance with embodiments illustrated in FIG. 5D, the plurality of pyramid shaped structures 305 are aligned in the alternating pattern. In some embodiments, the bases of adjacent pyramid shaped structures 305 are spaced apart from each other in a range (S1) between 0 μm and 100 μm. In some embodiments, a length of the base of the pyramid shaped structure 305 (L1) is in a range between 100 μm and 700 μm. In some embodiments, a length between apexes (vertexes) of adjacent pyramid shaped structures 305 is in a range (L2) between 100 μm and 700 μm.

Figure 5E:
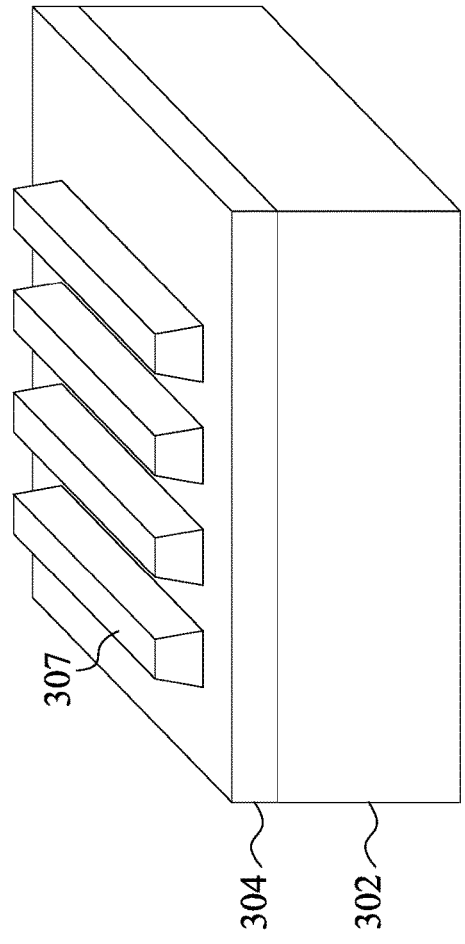
Figure 5F:
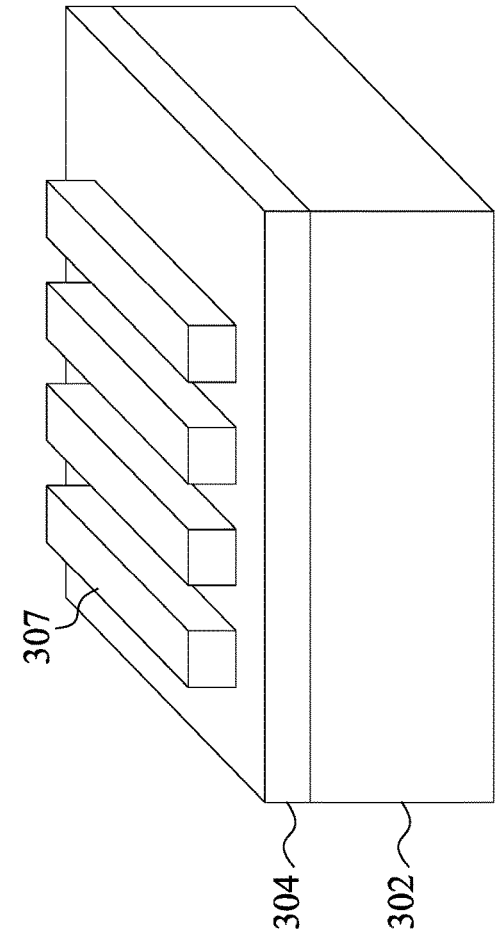

Each of the FIGS. 5E and 5F is a perspective cross-sectional view of the cleaning pad 120 that is configured to attach to the second side 106 of the portable handheld cleaning device 100 according to one or more embodiments of the present disclosure.

Referring to FIG. 5E, in accordance with various illustrated embodiments, the cleaning pad 120, which is coupled (or attached) to the portable handheld cleaning device 100 includes a base layer 302, an adhesive layer 304 on the base layer 302, and a plurality of isosceles trapezoid bar shaped structures 307 on the adhesive layer 304.

Referring to FIG. 5F, in accordance with various illustrated embodiments, the cleaning pad 120, which is coupled (or attached) to the portable handheld cleaning device 100 includes a base layer 302, an adhesive layer 304 on the base layer 302, and a plurality of square (or rectangular) bar shaped structures 307 on the adhesive layer 304.

Figure 5G:
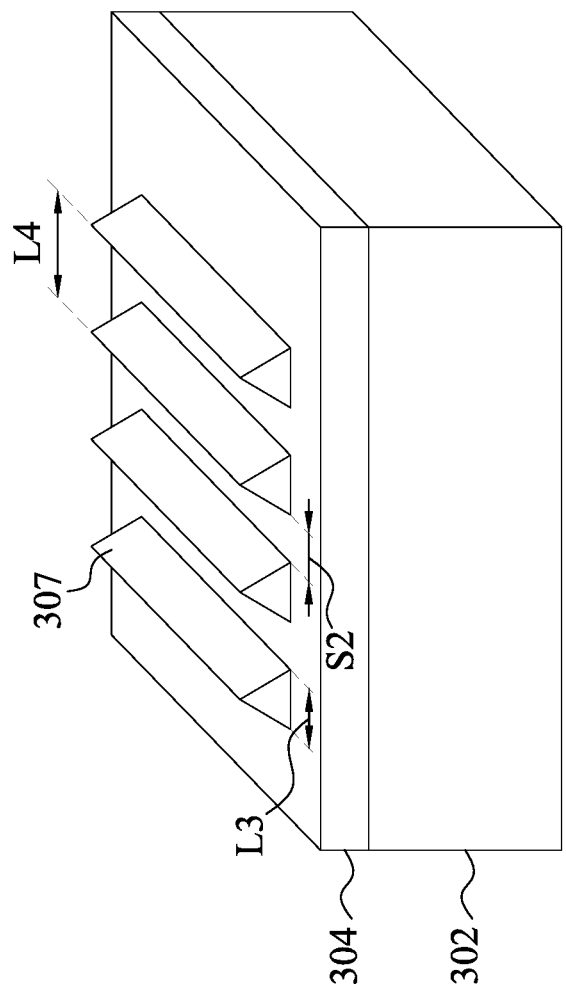

FIG. 5G is a perspective cross-sectional view of the cleaning pad 120 that is configured to attach to the second side 106 of the portable handheld cleaning device 100 according to one or more embodiments of the present disclosure.

Referring to FIG. 5G, the plurality of bar shaped structures 307 is constructed of triangular-based bar shaped structures.

In accordance with embodiments illustrated in FIG. 5G, the plurality of triangular-bar shaped structures 305 are aligned in the alternating pattern. In some embodiments, the bases of adjacent bar shaped structures 307 are spaced apart from each other in a range (S2) between 0 μm and 30 μm. In some embodiments, a length of the base of the bar shaped structure 307 (L3) is in a range between 20 μm and 100 μm.

In some embodiments, a length between vertexes of adjacent bar shaped structures 307 is in a range (L4) between 20 µm and 100 µm.

Figure 6:
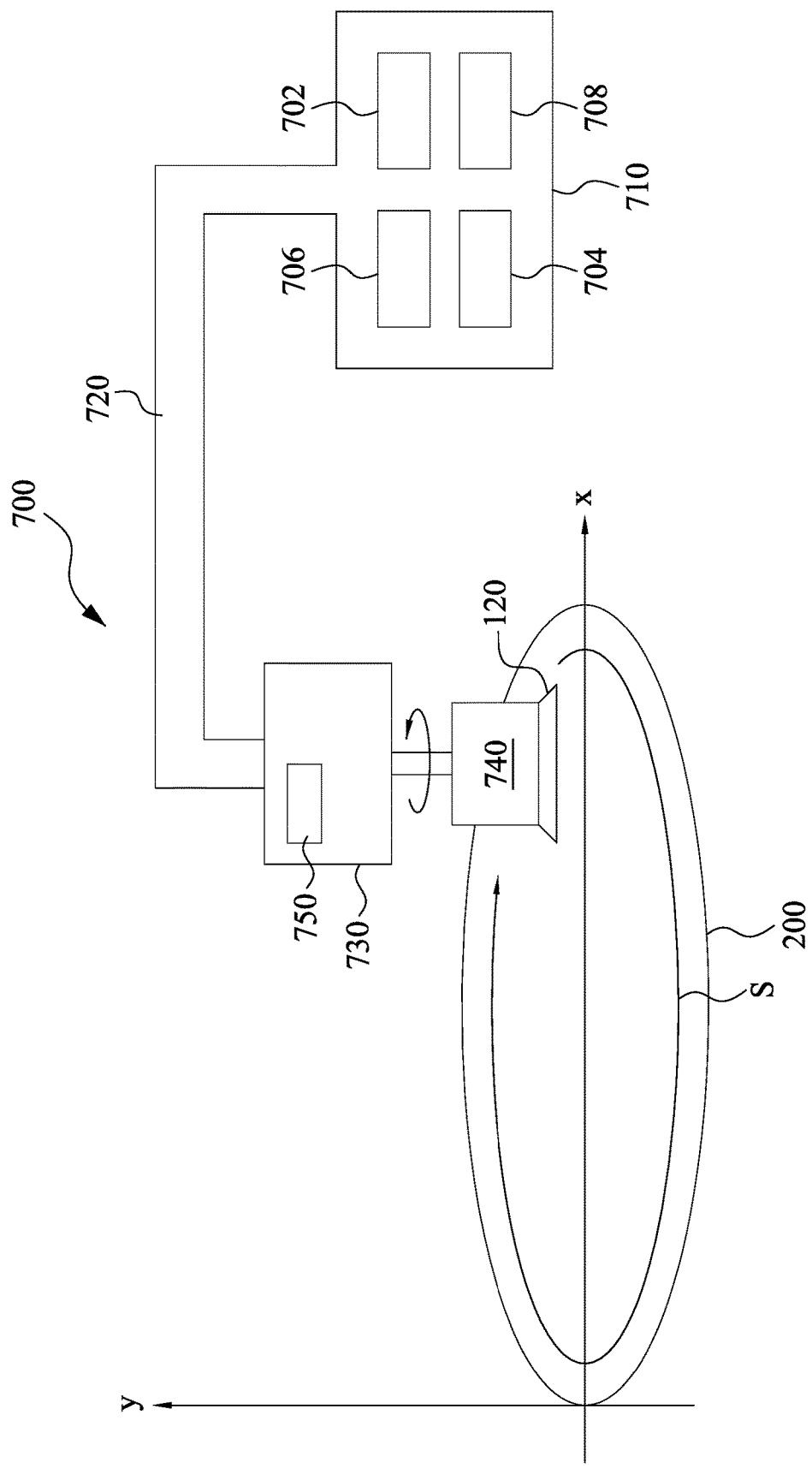
FIG. 6 is a schematic view of the substrate table 200 that is being cleaned by an automated cleaning device 700 with a feedback circuitry 750 according to one or more embodiments of the present disclosure.

FIG. 6 is a schematic view of the substrate table 200 that is being cleaned by an automated cleaning device 700 with a feedback circuitry 750 according to one or more embodiments of the present disclosure.

Referring to FIG. 6, the automated cleaning device 700 includes a controller 710, a robot arm 720 controlled by the controller 710, a rotating mechanism 730 (e.g., servo motor) on a first end of the robot arm 720, a cleaning member 740 rotated by the rotating mechanism 730, and the feedback circuitry 750 in the rotating mechanism 730.

Automated cleaning device 700 is configured to clean the surface 202 of the substrate table 200 and detect particles on the surface 202 at the same time. Unlike a conventional method, which requires cleaning the entire surface 202 of the substrate table 200 several times until particles that could impact the ability of the substrate to lie flat on the substrate table 200 are removed, the automated cleaning device 700 can clean one or more target locations where particles are detected and remove such particles.

In accordance with one or more embodiments of the present disclosure, the rotating mechanism 730 includes the feedback circuitry 750 that monitors the status of the rotating mechanism 730 (e.g., actual rotational speed (RPM) and/or rotational torque) which rotates the cleaning member 740. In some embodiments, the feedback circuitry 750 provides the status information (e.g., actual rotational speed (RPM) and/or rotational torque) to the controller 710. In some embodiments, the feedback circuitry 750 adjusts current and/or voltage to the rotating mechanism 730 so that the rotating mechanism 730 rotates the cleaning member 740 at a speed and/or torque as requested by the controller 710.

In some embodiments of the present disclosure, the cleaning member 740, which is rotated by the rotating mechanism 730, includes the cleaning pad 120. As discussed above, the cleaning pad 120 is used to scrub the surface 202 of the substrate table 200. In some embodiments, the cleaning pad 120 includes the plurality of pyramid shaped structures 305 (and/or the plurality of bar shaped structures 307). As discussed above, the plurality of pyramid shaped structures 305 (and/or the plurality of bar shaped structures 307) on the adhesive layer 304 is constructed of any suitable material that can remove the contaminants on the surface 202 of the substrate table 200 without damaging the surface 202. For a non-limiting example, the plurality of pyramid shaped structures 305 (and the plurality of bar shaped structures 307) may be constructed of silicon carbide (SiC), silicon nitride (Si3N4), aluminum nitride (AlN), or combinations thereof. The plurality of pyramid shaped structures 305 and the plurality of bar shaped structures 307 are not limited to being constructed from the exemplary materials mentioned above but may be formed of any suitable materials having a similar hardness of the surface 202 of the substrate table 200.

In some embodiments of the present disclosure, the cleaning member 740 includes a stone disk instead of the cleaning pad 120. If the cleaning member 740 is equipped with the stone disk, a surface of the stone disk is used to scrub the surface 202 of the substrate table 200.

The stone disk is constructed of any suitable material that has the ability to scrub and remove particles (contaminants) on the surface 202 of the substrate table 200 without damaging the surface 202. In some embodiments, to prevent the damage on the surface 202, the hardness of the stone disk surface is equal or less than the hardness of the surface 202 of the substrate table 200. For a non-limiting example, the stone disk may be constructed of silicon carbide (SiC), silicon nitride (Si3N4), aluminum nitride (AlN), granite, marble, quartz, or combinations thereof. The stone disk is not limited to being constructed from the exemplary materials mentioned above but may be formed of any material that can remove the particles on the surface 202.

In some embodiments of the present disclosure, the robot arm 720, controlled by the controller 710, transports the cleaning member 740 (which is rotated by the rotating mechanism 730) to the surface 202 of the substrate table 200 and moves the cleaning member 740 in a certain cleaning pattern on the surface 202. In the illustrated embodiment shown in FIG. 6, the robot arm 720 moves the cleaning member 740 based on a swirl pattern S. However, the present disclosure does not limit the pattern to be swirl only. For a non-limiting example, the moving pattern can be a zigzag pattern, random pattern, or other suitable pattern that covers the surface 202.

In some embodiments of the present disclosure, the robot arm 720 transmits a current location of the cleaning member 740 (e.g., x-y coordinate) on the surface 202 to the feedback circuitry 750. As discussed above, the feedback circuitry 750 provides the monitoring information (e.g., actual rotational speed (RPM) and/or rotational torque) of the rotating mechanism 730 to the controller 710 according to one or more embodiments of the present disclosure. In some embodiments, the feedback circuitry 750 transmits the monitoring information and corresponding x-y coordinates of the cleaning member 740 to the controller 710.

In one or more embodiments of the present disclosure, a processor 706 in the controller 710 determines particle location on the surface 202 based on the monitoring information and the corresponding x-y coordinates of the cleaning member 740. For a non-limiting example, the processor 706 determines the location (e.g., x-y coordinate) of the particle on the surface 202 based on the rotational speed of the cleaning member 740.

When the cleaning member 740 is rotating on the surface 202 and making the certain cleaning pattern on the surface 202, the feedback circuitry 750 collects the actual rotational speed and/or rotational torque of the rotating mechanism 730. In other words, the feedback circuitry 750 collects the actual rotational speed and/or rotational torque of the cleaning member 740 rotated by the rotating mechanism 730. Feedback circuitry 750 transmits the actual rotational speed and/or rotational torque data to the controller 710.

In some embodiments of the present disclosure, the controller 710 determines one or more locations of the particle on the surface 202 of the substrate table 200 based on the actual rotational speed and/or rotational torque data received from the feedback circuitry 750. In some embodiments, the controller 710 determines the particle location on the surface 202 based on the difference between actual rotational speed (and/or torque) of the cleaning member 740 (e.g., rotational speed of the rotating member 730) and rotational speed (and/or torque) of the cleaning member 740 requested by the controller 710. In some embodiments of the present disclosure, the controller 710 determines one or more locations of the particle on the surface 202 of the substrate table 200 based on the difference between an average actual rotational speed (and/or torque) of the cleaning member 740 on the surface 202 and actual rotational speed (and/or torque) of the cleaning member 740 on the surface 202 at each coordinate on the surface 202. Details of the controller 710 and method of determining the particle on the surface 202 will be provided later in the present disclosure.

Controller 710 controls the location of the cleaning member 740 on the surface 202 of the substrate table 200 by controlling the robot arm 720 (which the cleaning member 740 is attached to). In some embodiments, the controller 710 controls the rotational speed and/or torque of the cleaning member 740 precisely.

In accordance with one or more embodiments of the present disclosure, the controller 710 includes an input circuitry 702, a memory 704, a processor 706, and an output circuitry 708. Controller 710 includes the (computer) processor 706 configured to perform the various functions and operations described herein including receiving input data from various data sources (e.g., feedback data from feedback circuitry 750 and present coordinate data of the cleaning member 740 on the surface 202 of the substrate table 200) via the input circuitry 702 and transmitting output data (e.g., position control signal for robot arm 720 and rotating control signal for the rotating mechanism 730) via the output circuitry 708.

In some embodiments of the present disclosure, the processor 706 transmits the position control signal to robot arm 720. In some embodiments, the processor 706 transmits the rotating control signal to the rotating mechanism 730. Based on the position control signal from the processor 706, the robot arm 720 transports the cleaning member 740 to the surface 202 of the substrate table 200 and moves the cleaning member 740 in a certain cleaning pattern on the surface 202. In some embodiments, the position control signal is used to control an amount of pressure applied to the surface 202 of the substrate table 200. In some embodiments, an even pressure is applied to the surface 202 of the substrate table 200. While the cleaning member 740 is on the surface 202 of the substrate table 200, the rotating mechanism 730 rotates the cleaning member 740 based on the rotating control signal transmitted from the processor 706.

In some embodiments, the feedback circuitry 750 in the rotating mechanism 730 transmits actual rotational speed and/or torque of the cleaning member 740 to the memory 704. The feedback date from the feedback circuitry 750 is stored in the memory 704 along with corresponding location of the cleaning member 740 on the surface 202 of the substrate table 200.

In some embodiments, the processor 706 determines at least one location (e.g., coordinate on the surface 202 of the substrate table 200) where a particle (contaminant) is located on the surface 202. As discussed above, the memory 704 stores feedback data received via the input circuitry 702. Memory 704 may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

In one or more embodiments of the present disclosure, the controller 710 determines one or more locations of the particle (contaminant) on the surface 202 of the substrate table 200 by analyzing the feedback data from the feedback circuitry 750.

Figure 7:
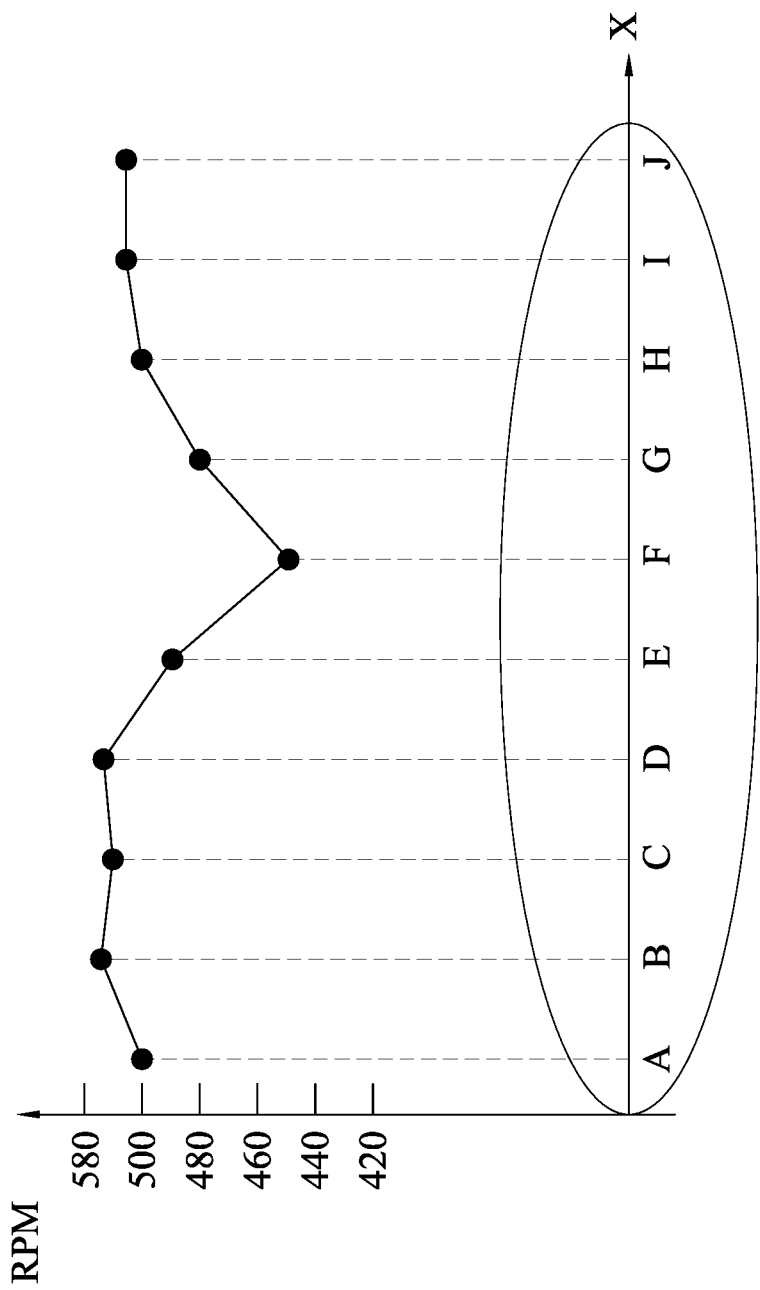
FIG. 7 is an exemplary graph that illustrates different rotational speeds of a cleaning member 740 at ten different locations on the surface 202 that are monitored by the feedback circuitry 750.

FIG. 7 is a graph that illustrates actual rotational speed of cleaning member 740 monitored by the feedback circuitry 750 at ten different locations on the surface 202 of the substrate 200. However, the present disclosure does not limit the number of locations monitored by the feedback circuitry 750.

FIG. 7 is an exemplary graph that illustrates different actual rotational speeds of a cleaning member 740 at ten different locations on the surface 202 that are monitored by the feedback circuitry 750.

Referring to FIG. 7, in accordance with the illustrated embodiment, the cleaning pad 120 is cleaning the surface 202 from the left side of the surface 202 to the right side of the surface 202 in a straight line pattern.

As discussed above, the feedback circuitry 750 provides actual rotational speed of the cleaning member 740 on the surface 202 of the substrate table 200 as illustrated in FIG. 7. In the illustrated embodiment, the controller 710 transmits the rotating control signal to the rotating mechanism 730 to rotate the cleaning member 740 at 500 rpm. As illustrated in FIG. 7, based on the feedback data from the feedback circuitry 750, the cleaning member 740 rotates around 500 rpm at location A, location B, location C, location D, location H, location I, and location J. At location E, location F, and location G, based on the feedback data from the feedback circuitry 750, the cleaning member 740 rotates below 500 rpm.

At location E, location F, and location G, the cleaning member 740 rotates at a speed slower than the requested speed. This indicates that there is a contaminant (particle) on the surface 202 that creates frictions that slow down the rotation of the cleaning member 740.

In some embodiments of the present disclosure, based on the feedback data (e.g., actual rotational speed and/or torque of the cleaning member 740) from the feedback circuitry 750, the processor 706 of the controller 710 determines one or more locations where the cleaning member 740 rotates slower than the requested speed. In some embodiments, additional cleaning by the cleaning member 740 is performed at the determined locations after completing the cleaning pattern. In some embodiments, additional cleaning by the cleaning member 740 is performed by delaying the movement of the cleaning member 740 to a subsequent location in the pattern on the surface 202 of the substrate table 200. In some embodiments, more pressure is applied by the cleaning member 740 at the determined location.

Referring back to FIG. 7, based on the locations determined by the processor 706, the controller 710 transmits the position control signal and rotating control signal to the robot arm 720 and rotating mechanism 730, respectively to perform the additional cleaning at location E, location F, and location G.

As discussed above, in some embodiments of the present disclosure, the controller 710 receives the feedback data from the feedback circuitry 750. Based on the feedback data received, the controller 710 determines one or more locations where the speed of the cleaning member 740 is less than the speed request by the controller 710 (e.g., rotating control signal). Based on the determined locations on the surface 202 of the substrate table 200, the controller 710 transmits the position control signal and rotating control signal to the robot arm 720 and the rotating mechanism 730, respectively, to perform an additional cleaning on the determined locations.

In some embodiments of the present disclosure, the controller 710 receives the feedback data from the feedback circuitry 750. Based on the feedback data received, the controller 710 determines a location where the actual rotational speed of the cleaning member 740 is less than the rotational speed request by the controller 710 (e.g., rotating control signal). In some embodiments, in response to the determination of the location, the controller 710 transmits the position control signal to the robot arm 720 to slow down the cleaning member 740 from moving to the subsequent location so an additional cleaning is performed on the determined locations. In some embodiments, in response to the determination of the location, the controller 710 transmits the rotating control signal to the rotating mechanism 730 to increase the rotational speed of the cleaning member 740 so an additional cleaning is performed on the determined locations. In some embodiments, in response to the determination of the location, the controller 710 transmits the position control signal so more pressure is applied by the cleaning member 740 at the determined location. In some embodiments, in response to the determination of the location, the controller 710 transmits the position control signal and rotating control signal to the robot arm 720 and the rotating mechanism 730, respectively, to perform an additional cleaning on the determined locations as discussed above.

In some embodiments of the present disclosure, the controller 710 receives the feedback data from the feedback circuitry 750. Based on the feedback data received, the controller 710 determines an average actual rotational speed of the cleaning member 740 on the surface 202 of the substrate table 200. Controller 710 determines one or more locations where the rotational speed of the cleaning member 740 is more than the determined average actual rotational speed. Based on the determined locations on the surface 202 of the substrate 200, the controller 710 transmits the position control signal and rotating control signal to the robot arm 720 and the rotating mechanism 730, respectively, to perform an additional cleaning on the determined locations as discussed above.

Figure 8:
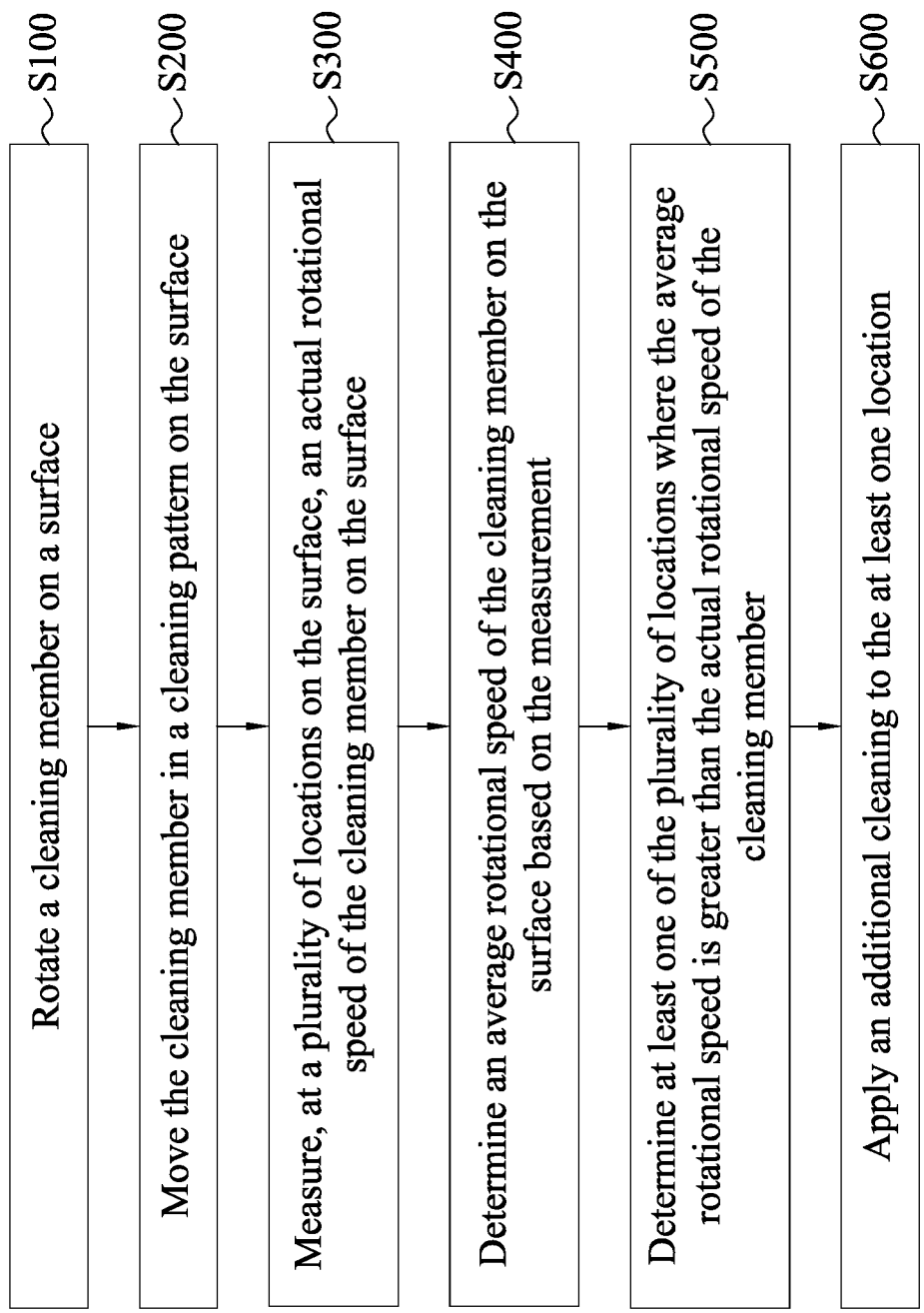
FIG. 8 is a flow chart illustrating a method of cleaning the surface 202 of the substrate table 200 according to one or more embodiments of the present disclosure.

FIG. 8 is a flow chart illustrating a method of cleaning the surface 202 of the substrate table 200 according to one or more embodiments of the present disclosure.

Referring to FIG. 8, the method of cleaning the surface 202 of the substrate table 200 includes: step S100 of rotating the cleaning member 740 on the surface 202; step S200 of moving the cleaning member 740 in a cleaning pattern on the surface 202 of the substrate table 200; step S300 of measuring, at a plurality of locations on the surface, an actual rotational speed of the cleaning member 740 on the surface 202; step S400 of determining an average actual rotational speed of the cleaning member 740 on the surface 202 based on the measurement; step S500 of determining at least one of the plurality of locations where the average actual rotational speed of the cleaning member 740 is greater than the actual rotational speed of the cleaning member 740; and step S600 of applying an additional cleaning to the at least one location.

Step S100 of rotating the cleaning member 740 on the surface 202 of the substrate table 200 includes a step of cleaning the surface 202 without damaging the surface 202. As discussed above, during the cleaning, the cleaning member 740 having a specific hardness rotates on the surface 202 of the substrate table 200 to scrub particles on the surface 202 without damaging the surface 202.

Step S200 of moving the cleaning member 740 in a cleaning pattern on the surface 202 includes a step of cleaning the entire surface 202 by moving the cleaning member 740 on the surface 202.

Step S300 of measuring, at a plurality of locations on the surface 202, an actual rotational speed of the cleaning member 740 on the surface 202 includes a step of measuring the actual rotational speed of the cleaning member 740 using the feedback circuitry 750. As discussed above, the rotating mechanism 730 includes the feedback circuitry 750 that monitors the status of the rotating mechanism 730 (e.g., actual rotational speed (RPM) and/or actual rotational torque) which rotates the cleaning member 740. Feedback circuitry 750 provides the feedback data (e.g., actual rotational speed (RPM) and/or actual rotational torque of the rotating mechanism 730 that rotates the cleaning member 740) to the controller 710 directly or indirectly.

Step S400 of determining an average actual rotational speed of the cleaning member 740 on the surface 202 based on the measurement includes a step of determining the average actual rotational speed of the cleaning member 740 based on the feedback data received. As discussed above, the input circuitry 702 of the controller 710 receives the feedback data from the feedback circuitry 750. Processor 706 of the controller 710 determines the average actual rotational speed of the cleaning member 740 on the surface 202 based on the feedback data. In alternative embodiments, the feedback circuitry 750 includes a processor which determines the average actual rotational speed of the cleaning member 740 on the surface 202 based on the feedback data and transmits the determined average speed of the cleaning member 740 to the controller 710.

Step S500 of determining at least one of the plurality of locations where the average actual rotational speed of the cleaning member 740 is greater than the actual rotational speed of the cleaning member 740 includes a step of determining at least one location on the surface 202 where the average actual rotational speed of the cleaning member 740 is greater than the actual rotational speed of the cleaning member 740. As discussed above, the processor 706 of the controller 710 determines at least one location on the surface 202 where the actual rotational speed of the cleaning member 740 is less than the determined average actual rotational speed of the cleaning member 740. In alternative embodiments, the feedback circuitry 750 includes a processor which determines the at least one location on the surface 202 where the actual rotational speed of the cleaning member 740 is less than the determined average actual rotational speed of the cleaning member 740 on the surface 202.

Step S600 of applying an additional cleaning to the at least one location includes a step of cleaning the at least one location to scrub the particle on the surface 202 identified by the lower speed of the cleaning member 740 due to friction created by the particle. In some embodiments, in response to the determination of the location, the controller 710 transmits the position control signal and rotating control signal to the robot arm 720 and the rotating mechanism 730, respectively, to perform an additional cleaning on the determined locations as discussed above.

Figure 9:
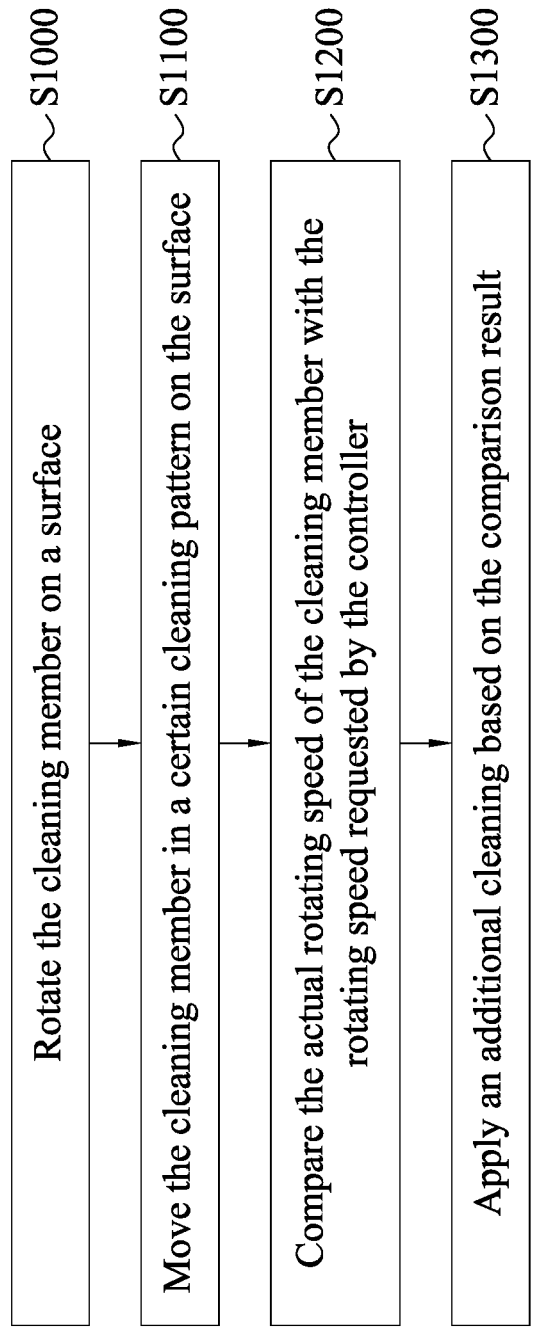
FIG. 9 is a flow chart illustrating another method of cleaning the surface 202 of the substrate table 200 according to one or more embodiments of the present disclosure.

FIG. 9 is a flow chart illustrating another method of cleaning the surface 202 of the substrate table 200 according to one or more embodiments of the present disclosure.

Referring to FIG. 9, the method of cleaning the surface 202 of the substrate table 200 includes: step S1000 of rotating the cleaning member 740 on the surface 202; step S1100 of moving the cleaning member 740 in a certain cleaning pattern on the surface 202; step S1200 of comparing the actual rotational speed of the cleaning member 740 with the rotational speed requested by the controller 710; and step S1300 of applying an additional cleaning based on the comparison result.

Step S1000 of rotating the cleaning member 740 on the surface 202 of the substrate table 200 includes a step of cleaning the surface 202 without damaging the surface 202. As discussed above, during the cleaning, the cleaning member 740 having a specific hardness rotates on the surface 202 of the substrate table 200 to scrub particles on the surface 202 without damaging the surface 202.

Step S1100 of moving the cleaning member 740 in a certain cleaning pattern on the surface 202 includes a step of cleaning the entire surface 202 by moving the cleaning member 740 on the surface 202.

Step S1200 of comparing the actual rotational speed of the cleaning member 740 with the rotational speed requested by the controller 710 includes a step of identifying particle on the surface 202. As discussed above, the input circuitry 702 of the controller 710 receives the feedback data from the feedback circuitry 750. Processor 706 of the controller 710 compares the actual rotational speed of the cleaning member 740 on the surface 202 with the rotational speed requested by the controller 710.

Step S1300 of applying the additional cleaning based on the comparison result includes a step of cleaning the location to scrub a particle on the surface 202 identified by the lower speed of the cleaning member 740 due to friction created by the particle. In some embodiments, in response to the determination of the location, the additional cleaning by the cleaning member 740 is performed by delaying the movement of the cleaning member 740 to a subsequent location on the surface 202 of the substrate table 200. In some embodiments, in response to the determination of the location, the additional cleaning by the cleaning member 740 is performed by increasing the rotational speed of the cleaning member 740 on the determined location on the surface 202 of the substrate table 200.

Utilizing the portable handheld cleaning device 100 will produce a substantial cost savings with less defects in the photolithography step in the fabrication. The portable handheld cleaning device 100 includes the cleaning pad 120 that is configured to remove any contaminants on the burls 204 and spaces between the burls 204 as a cleaning operator moving the portable handheld cleaning device 100 on the surface 202.

Utilizing the automated cleaning device 700 will produce a substantial cost savings with less defects in the photolithography step in the fabrication. Automated cleaning device 700 includes a feedback circuitry 750 that is configured to monitor the status of the rotating mechanism 730 (e.g., rotational speed (RPM)) which rotates the cleaning member 740. Based on the feedback data from the feedback circuitry 750, the controller 710 is able to determine at least one or more locations where an additional cleaning is required.

According to one or more embodiments of the present disclosure, a portable handheld cleaning device is provided capable of cleaning the surface of the substrate table without damaging the surface. The portable handheld cleaning device in accordance with the present disclosure includes a base having a first side and a second side (the first side and the second side overlapping to each other), a hollow structure on the first side of the base, and a weight holding space within the hollow structure. A grinding pad is provided on the second side of the base. The grinding pad includes a cleaning surface, the cleaning surface having a plurality of substantial pyramid shaped grits.

According to one or more embodiments of the present disclosure, a surface cleaning device is provided capable of detecting and cleaning the particle on the surface of the substrate table without damaging the surface. The surface cleaning device in accordance with the present disclosure includes a controller, a cleaning member having at least one scrubbing surface, a rotating mechanism that rotates the cleaning member in response to a rotating control signal from the controller, the rotating control signal includes a rotational speed setting, a robot arm transports the rotating mechanism that carries the cleaning member on a surface, and a feedback circuitry transmitting actual rotational speed of the cleaning member to the controller at a plurality of locations on the surface. The controller in the surface cleaning device is configured to determine at least one location on the surface where a particle is located based on a rotational speed from the rotational speed setting and the actual rotational speed of the cleaning member.

According to one or more embodiments of the present disclosure, a method of detecting and cleaning a particle on a surface includes rotating a cleaning member on a surface. The method includes moving the cleaning member in a cleaning pattern on the surface. The method includes measuring, at a plurality of locations on the surface, an actual rotational speed of the cleaning member on the surface. The method includes determining an average rotational speed of the cleaning member on the surface based on the measurement. The method includes determining at least one of the plurality of locations where the average rotational speed is greater than the actual rotational speed of the cleaning member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A portable cleaning device, comprising:
a base having a first side and a second side opposite to the first side, the first side and the second side are aligned with each other along a vertical direction, and the first side and the second side face away from each other;
a hollow structure defined by the first side of the base and a sidewall that extends upward from the base, and the hollow structure includes a weight holding space delimited by the sidewall and the base;
at least one weight alignment structure within the weight holding space, wherein the weight alignment structure is a post that extends upwards from the base; and
a grinding pad adjacent to the second side of the base, wherein the grinding pad includes a cleaning surface, the cleaning surface having a plurality of structures substantially shaped like pyramids, and the cleaning surface is configured to, in operation, clean a respective surface of a respective semiconductor substrate table, and
wherein the post of the at least one weight alignment structure includes threads configured to, in operation, threadedly engage with one or more weight members.

2. The portable cleaning device of claim 1, wherein the grinding pad includes a grinding base pad, and the plurality of structures are coupled to the grinding base pad by an adhesive layer on the grinding base pad.

3. The portable cleaning device of claim 1, wherein the post of the at least one weight alignment structure further includes an indicator configured to, in operation, indicate a maximum height one or more weight members to be inserted into the weight holding space along the post of the at least one weight alignment structure.

4. The portable cleaning device of claim 1, wherein a hardness of the plurality of substantial pyramid shaped structures is in a range between 800 HV and 3000 HV.

5. The portable cleaning device of claim 1, wherein the plurality of structures substantially shaped like pyramids is formed with silicon carbide.

6. The portable cleaning device of claim 1, wherein the plurality of structures substantially shaped like pyramids includes a first pyramid shaped structure and a second pyramid shaped structure,
wherein the first pyramid shaped structure and the second pyramid shaped structure are parallel to each other.

7. The portable cleaning device of claim 6, wherein the first pyramid shaped structure includes a first apex and the second pyramid shaped structure includes a second apex, and
wherein the first and second apexes are aligned in a first direction.

8. The portable cleaning device of claim 1, wherein each respective structure of the plurality of structures is a triangular-based pyramid shape structure.

9. The portable cleaning device of claim 8, wherein a length for the base of the triangular-based pyramid shape structure is in a range between 100 μm and 700 μm.

10. The portable cleaning device of claim 8, wherein a spacing between adjacent triangular-based pyramid shaped structures is in a range between 0 μm and 100 μm.

11. The portable cleaning device of claim 1, wherein the post is aligned with the grinding pad.

12. A portable cleaning device, comprising:
a base having a first side and a second side opposite to the first side, the first side and the second side are aligned with each other along a vertical direction, and the first side and the second side face away from each other;
a hollow structure defined by the first side of the base and a sidewall that extends upward from the base, and the hollow structure includes a weight holding space, the weight holding space is delimited by the base and the sidewall of the hollow structure;
at least one alignment structure within the weight holding space, wherein the weight alignment structure is a post that extends upwards from the base, the post is configured to, in operation, receive one or more weight members aligning the one or more weight members within the weight holding space; and
a grinding pad adjacent to the second side of the base, the grinding pad includes:
a grinding pad base; and
a plurality of structures coupled to the grinding pad base, the plurality of structures protruding outwards and away from the grinding pad base, the plurality of structures are configured to, in operation, clean the respective surface of the respective semiconductor substrate table,
wherein the post of the at least one weight alignment structure includes threads configured to, in operation, threadedly engage with the one or more weight members within the weight holding space and along the post of the at least one weight alignment structure.

13. The portable cleaning device of claim 12, wherein the plurality of structures has a hardness that is in a range between 800 HV and 3000 HV.

14. The portable cleaning device of claim 12, wherein the plurality of structures are coupled to the grinding pad base by an adhesive.

15. The portable cleaning device of claim 12, wherein the plurality of structures have a substantial pyramid shape.

16. The portable cleaning device of claim 12, wherein the plurality of structures have a substantial pentagonal pyramid-base shape.

17. The portable cleaning device of claim 12, wherein the plurality of structures have a trapezoid bar shape.

18. The portable cleaning device of claim 12, wherein the plurality of structure have a rectangular bar shape.

19. A portable cleaning device, comprising:
a base having a first side and a second side opposite to the first side, the first side and the second side are aligned with each other along a vertical direction, and the first side and the second side face away from each other;
a hollow structure defined by the first side of the base and a sidewall that extends upward from the base, the hollow structure includes a weight holding space, the weight holding space is delimited by the base and the sidewall of the hollow structure;
a grinding pad adjacent to the second side of the base, the grinding pad includes a cleaning surface, and the cleaning surface has a plurality of structures substantially shaped like pyramids, the plurality of structures substantially shaped like pyramids are configured to, in operation, clean a respective surface of a respective semiconductor substrate table; and
at least one weight alignment structure within the weight holding space, the at least one weight alignment structure is a post that extends upwards from the base;
at least one indicator along the post of the at least one weight alignment structure, the at least one indicator indicates a maximum dimension of one or more weight members configured to, in operation, be placed within the weight holding space, and
wherein the post of the at least one weight alignment structure includes threads configured to, in operation, threadedly engage with one or more weight members.

20. The portable cleaning device of claim 19, wherein:
the grinding pad further includes:
a grinding pad base; and
an adhesive on the grinding pad base; and
the plurality of structures are coupled to the grinding pad base by the adhesive, and the plurality of structures protruding outwards and away from the grinding pad base.

* * * * *